United States Patent
Chen et al.

(10) Patent No.: US 6,369,434 B1
(45) Date of Patent: Apr. 9, 2002

(54) NITROGEN CO-IMPLANTATION TO FORM SHALLOW JUNCTION-EXTENSIONS OF P-TYPE METAL OXIDE SEMICONDUCTOR FIELD EFFECT TRANSISTORS

(75) Inventors: Kai Chen, Hopewell Junction; Scott W. Crowder, Ossining; Liang-Kai Han, Fishkill; Michael J. Hargrove, Clinton Corners; Kam-Leung Lee, Putnam Valley, all of NY (US); Hung Y. Ng, New Milford, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/363,742
(22) Filed: Jul. 30, 1999
(51) Int. Cl.$^7$ ............................................... H01L 29/76
(52) U.S. Cl. ........................................ 257/402; 257/610
(58) Field of Search ................................ 257/336, 338, 257/344, 408, 402, 610

(56) References Cited

U.S. PATENT DOCUMENTS

| | | | |
|---|---|---|---|
| 4,689,667 A | 8/1987 | Aronowitz | 357/63 |
| 4,755,865 A | 7/1988 | Wilson et al. | 357/63 |
| 4,824,795 A | 4/1989 | Blanchard | 437/62 |
| 5,240,874 A | 8/1993 | Roberts | 437/69 |
| 5,350,941 A | 9/1994 | Madan | 257/647 |
| 5,397,720 A | 3/1995 | Kwong et al. | |
| 5,543,636 A | 8/1996 | Yamazaki | |
| 5,557,129 A | 9/1996 | Oda et al. | |
| 5,596,218 A | 1/1997 | Soleimani et al. | |
| 5,710,438 A | 1/1998 | Oda et al. | |
| 5,750,435 A | 5/1998 | Pan | |
| 5,757,045 A | 5/1998 | Tsai et al. | 257/336 |
| 6,225,151 B1 * | 1/2001 | Gardner et al. | 257/607 |
| 6,225,663 B1 * | 5/2001 | Yamaguchi et al. | 257/57 |

OTHER PUBLICATIONS

"Semiconductor Devices, Second Edition" b J.J. Sparkes. Chapman & Hall, pp. 181–188 (1994).

* cited by examiner

Primary Examiner—Fetsum Abraham
(74) Attorney, Agent, or Firm—Ratner & Prestia; Joseph P. Abate, Esq.

(57) ABSTRACT

A p-type MOSFET having very shallow p-junction extensions. The semiconductor device is produced on a substrate by creating a layer of implanted nitrogen ions extending from the substrate surface to a predetermined depth preferably less than about 800 Å. The gate electrode serves as a mask so that the nitrogen implantation does not filly extend under the gate electrode. Boron is also implanted to an extent and depth comparable to the nitrogen implantation thereby forming very shallow p-junction extensions that remain confined substantially within the nitrogen layer even after thermal treatment. There is thus produced a pMOSFET having very shallow p-junction extensions in a containment layer of nitrogen and boron in the semiconductor material.

4 Claims, 4 Drawing Sheets

NITROGEN CO-IMPLANTATION TO FORM SHALLOW JUNCTION-EXTENSIONS OF P-TYPE METAL OXIDE SEMICONDUCTOR FIELD EFFECT TRANSISTORS

TECHNICAL FIELD

The present invention relates generally to the manufacture of semiconductor devices. In particular, the present invention relates to a process for forming p-type metal oxide semiconductor field effect transistors (pMOSFETs) with shallow junction extensions.

BACKGROUND OF THE INVENTION

An "TET" is a Field Effect Transistor. There are two major types of FET's, the metal-oxide-semiconductor field effect transistor or MOSFET (also called an insulated-gate FET, or IGFET), and the junction-gate FET, or JFET. An FET has a control gate, and source and drain regions formed in a substrate. The control gate is formed above a dielectric insulator that is deposited over the area between the source and drain regions. As voltage is applied to the control gate, mobile charged particles in the substrate form a conduction channel in the region between the source and drain regions. Once the channel forms, the transistor turns "on" and current may flow between the source and drain regions.

A MOSFET is a three-terminal device that is used to control the flow of electric power. MOSFETs have only three semiconductor regions. A MOSFET controls the flow of power through the device in response to an appropriate control signal applied to its gate terminal. MOSFETs can be used to control the flow of electric power by selectively applying and removing an appropriate gate signal.

Very Large Scale Integration or "VLSI" (i.e., more than 100,000 devices per chip) has allowed the semiconductor chip industry to increase circuit density while still maintaining or even reducing cost. This advantage has been accomplished because the semiconductor industry can now fabricate silicon devices with sub-micron features (or microminiaturization). The attainment of sub-micron features has been achieved mainly by advances in specific semiconductor fabrication disciplines, such as photolithography and reactive ion etching (RIE).

"Photolithography" is a process in which a light source illuminates a circuit pattern and projects the image through a lens assembly onto a semiconductor wafer or substrate. Ultimately, the circuit pattern is etched into the wafer. The use of more sophisticated exposure cameras and the development of more sensitive photoresist materials have allowed sub-micron images in photoresist to be routinely obtained. Similar advances in dry etching tools and processes have resulted in the successful transfer of these sub-micron images in photoresist to underlying materials used for the fabrication of advanced CMOS (complimentary metal oxide semiconductor) devices.

With the trend to smaller devices, however, specific yield and performance detractors, as well as reliability risks, become more prevalent. For example, as the gate insulator of a CMOS device becomes thinner, in an attempt to improve device performance, the possibility of yield loss due to insulator breakdown becomes greater. In addition, as the channel length of the CMOS device becomes shorter, again to improve performance, the reliability risk of hot electron injection increases. Narrower channel lengths also present yield problems in terms of junction punch-through. As the channel length of a CMOS device shortens, the space between depletion regions, created from the source region and the substrate and from the drain region and substrate, becomes smaller and the consequent close proximity of adjacent regions can result in punch-through leakage.

CMOS circuits are made up of complementary pairs of nMOSFETs and pMOSFETs. MOSFETs can be classified into two types having different electrical polarities, i.e., negative MOSFETs (nMOSFETs) in which electrons flow through a channel region and positive MOSFETs (pMOSFETs) in which holes flow through a channel region. nMOSFETs and pMOSFETs are combined to form various kinds of circuits. NMOS refers to circuits made entirely of nMOSFETs.

The p-type region is typically formed by ion implantation of boron atoms. Ion implantation is a well-known technique that consists of bombarding the surface of the silicon with high energy ions in a vacuum. The ions penetrate into the silicon, to a depth depending on their energy, and, after an annealing treatment to remove lattice dislocations, convert a thin layer of silicon to p-type silicon. Because boron atoms have a small mass and a large diffusion coefficient, they have a strong tendency to diffuse at the temperatures used during a later heat treatment.

A pMOSFET of 0.15 microns or less requires a shallow p-junction extension (Pext) of 40 nm or less. When boron is used as the dopant in the formation of the junction extension of a pMOSFET, the large diffusion coefficient of boron makes it difficult to form a shallow Pext by traditional methods, such as by lowering the implantation energy or reducing the rapid thermal annealing (RTA) time or temperature because of the strong tendency of boron atoms to diffuse at high temperatures. For example, with an RTA of 1,000° C. for 5 seconds, the shallowest Pext that can be achieved is still much deeper than 50 nm. As the size of the FET shrinks, however, there is a need to make precisely controlled shallow Pexts reliably while avoiding device failures due to punch-through effects.

The need for the ability to make shallow Pexts has been recognized by the industry. One method for solving this problem is disclosed in U.S. Pat. No. 5,557,129 issued to Oda. This patent describes formation of an ultra shallow p-junction extension by an FET structure that includes a spacer comprising a vertical and a horizontal component surrounding the FET gate and extending about 1,000 to 3,000 Å from the gate. Such a structure introduces additional masking steps to the process of manufacturing the FET without addressing the problem of boron migration directly. Shallower Pext improves threshold voltage roll off, a key MOSFET design issue for deep sub-micron devices.

Thus, a need exists for a reliable process for forming pMOSFETs in which boron diffusion during thermal treatments does not adversely affect the p-junction shallow extensions.

SUMMARY OF THE INVENTION

To meet this and other needs, and in view of its purposes, the present invention provides a process for making a p-type field effect transistor. The process of the present invention comprises forming a gate on a substrate and forming a drain and a source in the substrate by doping the substrate with boron to form p-doped junction extensions. A containment layer is formed in the substrate extending from a surface of the substrate to a predetermined depth, exclusive of an area of the substrate under the gate. The containment layer consists essentially of implanted nitrogen, a p-type dopant, and a substrate selected from the group consisting of germanium and silicon.

The present invention also provides a semiconductor device with a substrate comprising a substrate material selected from the group consisting of silicon and germanium. An element is provided over the substrate defining a first area on the substrate and a containment layer in the substrate outside the defined first area. The containment layer consists essentially of implanted nitrogen, a p-type dopant, and the substrate material.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 2 illustrates an FET as built on a substrate, in an area where an n-type well has been created, with a metal oxide layer created on the surface of the substrate and with an electrode gate formed over the metal oxide layer;

FIG. 3 illustrates the semiconductor device following the steps of implanting boron ions and etching the metal oxide layer from the areas not covered by the gate;

FIG. 4 illustrates the formation of side wall spacers adjacent the gate;

FIG. 5 shows the semiconductor device following a second ion implantation of the boron dopant, forming the deep p-type junction portions which, together with the p-junction extensions, become the drain and the source of the FET;

FIG. 6 illustrates the step of $N_2$ co-ion implantation after the metal oxide layer and the gate have been created on the surface of the silicon wafer substrate in an n-well area;

FIG. 7 illustrates the formation of a containment layer;

FIG. 8 illustrates the step of boron ion implantation;

FIG. 9 illustrates the creation of side wall spacers to mask the p-junction extensions;

FIG. 10 shows the deep dopant implanted junction portions, extending into the substrate beyond the containment layer and outside the areas masked by the side wall spacers, and the shallow p-junction extensions containing boron and nitrogen with the boron confined substantially within the containment layer;

DETAILED DESCRIPTION OF THE INVENTION

The invention will next be described with reference to the figures in which the same reference numbers indicate the same elements throughout. Such figures are provided for purposes of illustration and not limitation and for these purposes elements or steps not essential in understanding the present invention are often omitted so as not to clutter the drawings.

The invention is a process for limiting the diffusion of a dopant such as boron in a semiconductor substrate such as silicon or germanium during heating of the substrate after it has been doped with the boron. This is particularly a problem in the manufacturing of FET transistors of the p-type, because boron in the p-junction trench tends to diffuse during a later annealing process step. Such diffusion extends the p-junction dimensions outside desired limits and causes manufacturing defects.

The invention will be described primarily using a comparison of the conventional manufacturing process for manufacturing a pMOSFET and the process according with the present invention. MOSFETs are particularly suitable for switching circuits and are widely used in calculators, watches, and digital computers. The selection of a MOSFET application is not limiting, however, and the invention is also suitable for other similar applications, including all junction field effect transistor applications.

Figure 1:
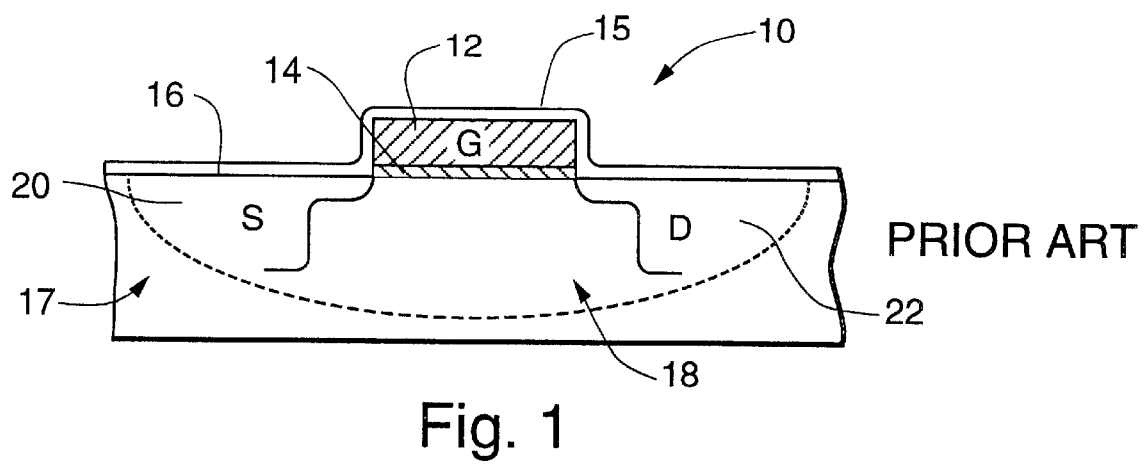
FIG. 1 is a schematic cross section of a conventional FET on a substrate showing the essential elements of the FET.

Referring now to FIG. 1, there is shown in schematic representation the main elements of a conventional p-type MOSFET 10. As is well known in the art, the pMOSFET 10 comprises a gate 12 over a metal oxide layer 14 such as $SiO_2$. The gate 12 and metal oxide layer 14 are built over the surface 16 of a semiconductor substrate 17 such as silicon, and particularly over the surface 16 of the substrate 17 in an area containing an n-type well 18. A source 20 and a drain 22 are formed adjacent and on either side of the gate 12. The source 20 and drain 22 comprise areas of the substrate 17 that have been doped with a p-type dopant (typically boron). An insulating layer 15 is typically formed over the FET. Electrical contacts to the source 20 and drain 22 are also provided (not shown).

The semiconductor device shown in FIG. 1 is typically formed through a series of manufacturing steps. Such steps are described in more detail in U.S. Pat. No. 5,557,129 and No. 5,757,045. FIGS. 2 through 5 illustrate the steps of the conventional process for making a p-type MOSFET that are pertinent in explaining the present invention.

Figure 2:
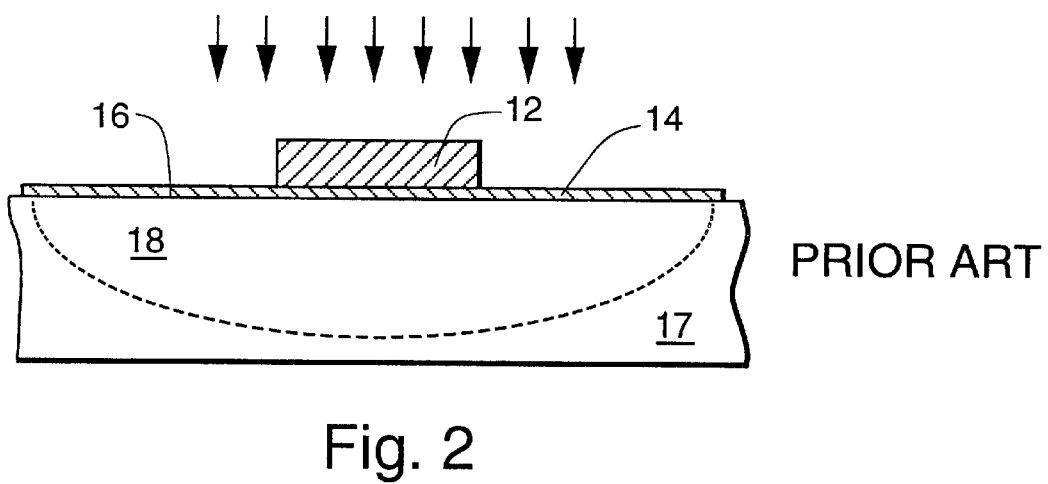
FIGS. 2 through 5 are schematic cross sections showing the essential steps in a conventional process for manufacturing a semiconductor device comprising p-doped junction extensions and, more specifically.

As shown in FIG. 2, the FET is built on a substrate 17, preferably a silicon wafer, in an area where an n-type well 18 has been created. A metal oxide layer 14, such as a silicon oxide layer, is created on the surface 16 of the substrate 17. Over the oxide layer is formed an electrode gate 12 which may be a metal or polysilicon, as is well known in the art.

Figure 3:
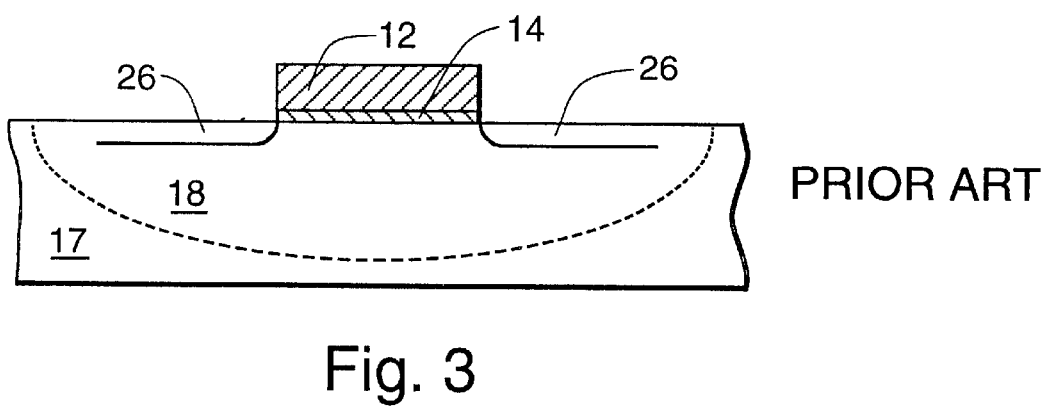

Ion implantation, using the gate 12 as a mask, is next used to implant a dopant into the substrate 17 adjacent the gate 12 to create a first doped layer 26. In typical applications, gate 12 is created by directing the ion bombardment of the substrate 17 along an axis substantially perpendicular (illustrated by the arrows in FIG. 2) to the substrate surface 16 and does not extend to any significant degree under the gate 12. In the case of a p-type junction MOSFET, the ion implantation comprises boron difluoride ($BF_2$). The resulting first doped layer 26 is a shallow layer implanted with boron. First doped layer 26 typically extends to a depth of 600 to 1,000 Å into the substrate 17 and forms the p-junction extension for the pMOSFET. FIG. 3 illustrates the semiconductor device following the steps of implanting boron ions and etching the metal oxide layer 14 from the areas not covered by the gate 12.

Figure 4:
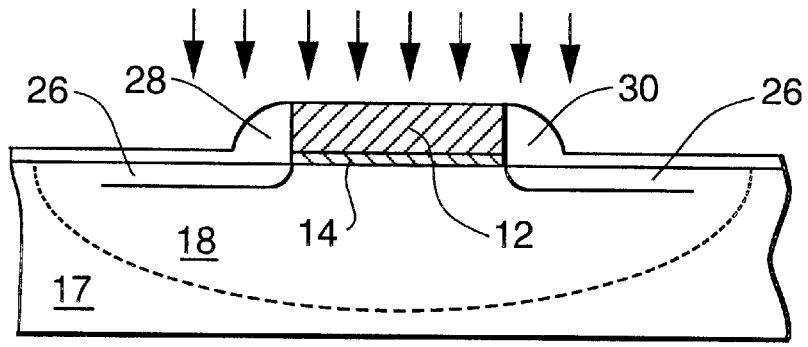
Figure 5:
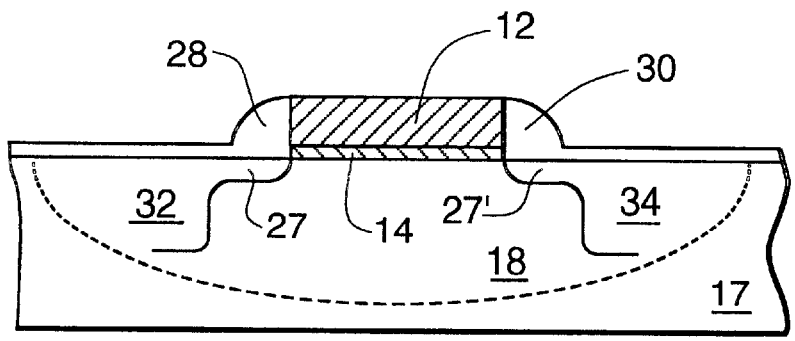

As is well known in the art, and illustrated in FIGS. 4 and 5, the creation of a drain region and a source region is typically done by first providing side wall spacers 28 and 30 adjacent the gate 12. After formation of the side wall spacers 28 and 30, a second ion implantation of the p-type dopant such as boron is performed to form the deep p-type junction portions 32 and 34 which, together with the p-junction extensions 27 and 27' following the addition of electrical contacts, become the drain and the source of the FET. The p-junction extensions 27 and 27' are formed by the portions of the first p-doped layer 26 under the side wall spacers 28 and 30. Because the wafer undergoes at least one heat treatment following the boron implantation, the size of the boron doped layers increases due to boron diffusion, thereby limiting the minimum size that can be obtained in the p-junction extensions 27 and 27' adjacent the gate 12.

Figure 6:
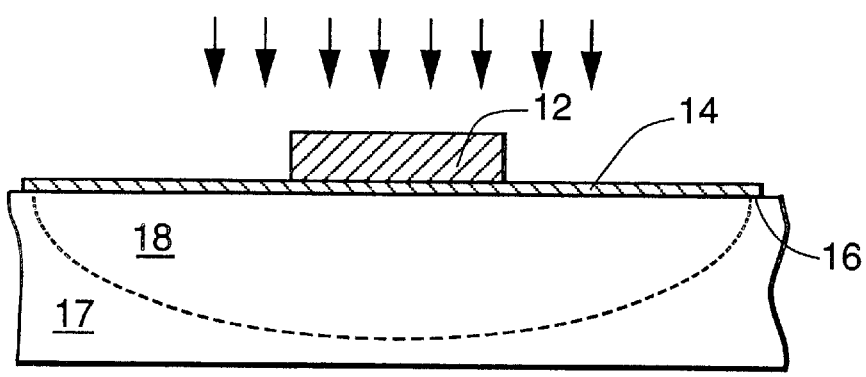
FIGS. 6 through 10 are schematic cross sections showing the essential steps used to manufacture a semiconductor device comprising p-doped junction extensions according to the present invention and, more specifically.
Figure 7:
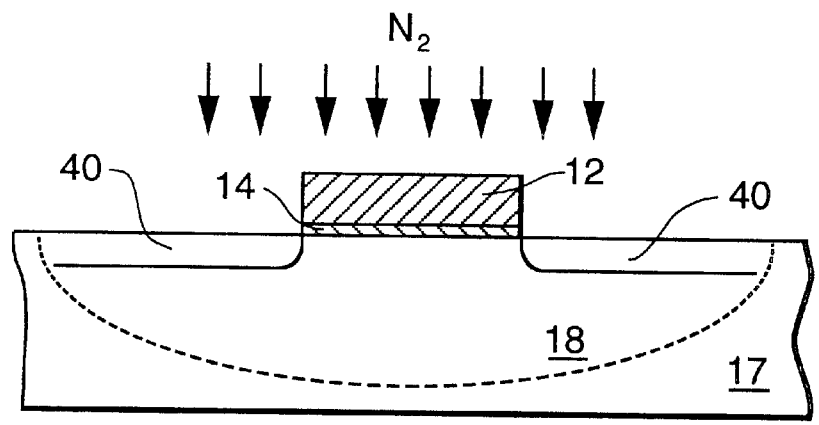
Figure 9:
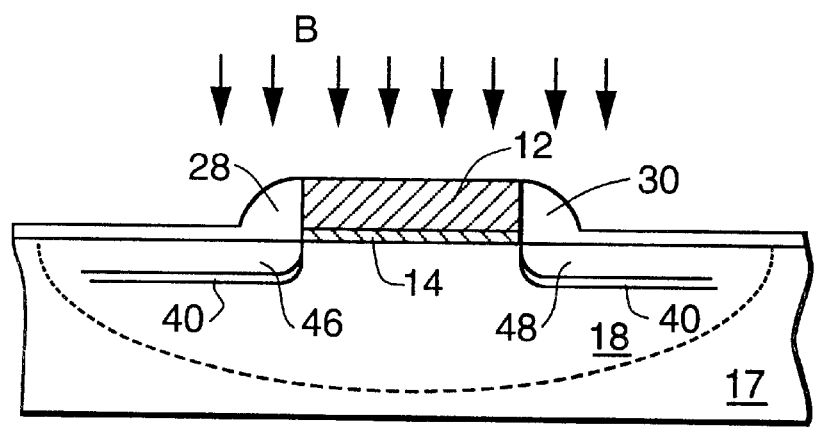
Figure 10:
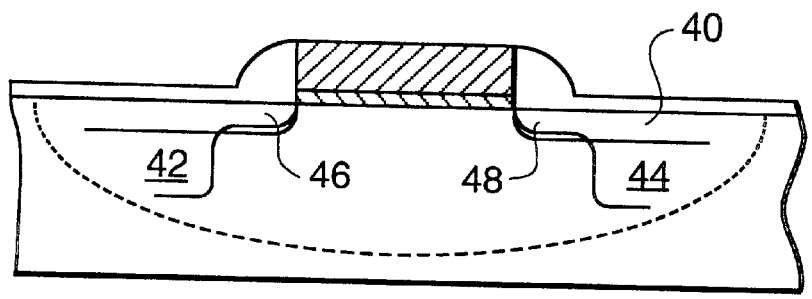
Figure 11:
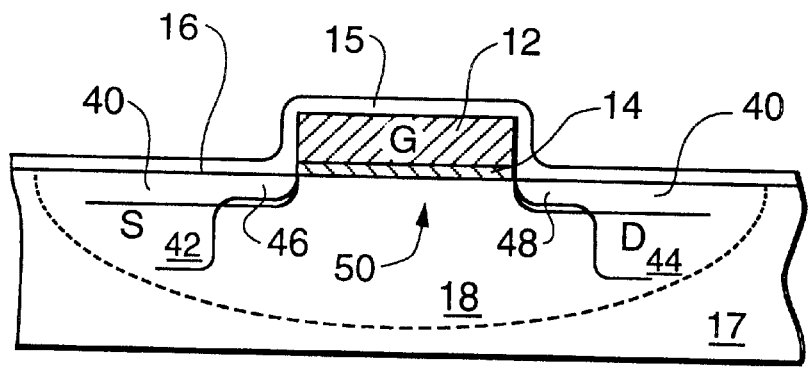
FIG. 11 is a schematic cross section of a pFET on a substrate produced according to the process of the present invention, showing the essential elements of the device.

According with the present invention, as illustrated in FIGS. 6–10, the steps of the traditional process described above for creating a p-type MOSFET are modified by the introduction of an additional step in which nitrogen is implanted to form a boron containment layer 40 resulting in a pMOSFET having the structure illustrated in FIG. 11. As shown in FIG. 6, after the metal oxide layer 14 and the gate 12 have been created on the surface 16 of the silicon wafer substrate 17 in an n-well area 18, the containment layer 40 is created by $N_2$ co-ion implantation, illustrated by the arrows in FIG. 6. Typically such co-implantation is done at a dose of between $1e^{14}$ to $1e^{15}$ ($1/cm^2$) at energy levels of between 20 and 30 Kev. The ion incidence angle, relative to the substrate surface 16, may vary from 90° to 45° depending on process conditions. Preferably, the containment layer 40 extends to about 300 Å to 800 Å into the substrate 17. When the implantation angle is 90°, because of the masking effect of the gate 12, the containment layer 40 does not extend under the gate 12; rather, the containment layer 40 extends outside the "footprint" area covered by the gate 12. In an alternate embodiment described later, the containment layer 40 may partially extend under the gate 12.

Figure 8:
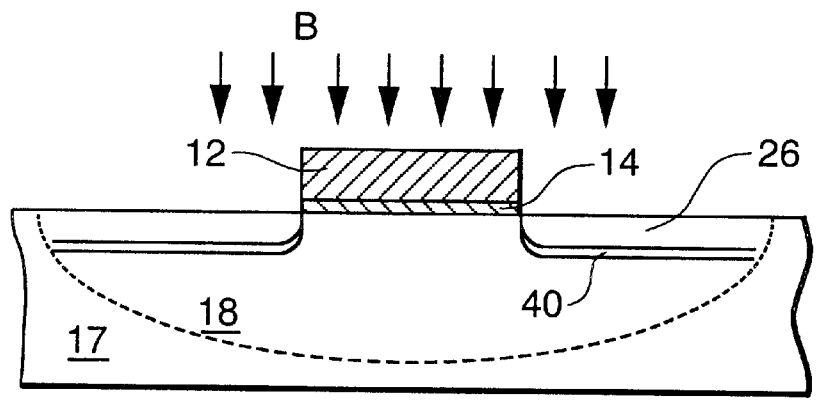

The nitrogen ion implantation is followed by the traditional first boron ion implantation along the arrows, illustrated in FIG. 8, preferably using boron difluoride to create the p-junction extensions 46 and 48. The boron implantation is controlled to implant boron preferably to a depth not exceeding the depth of the nitrogen implantation. There is thus formed in the n-type well 18 in the silicon substrate 17 a containment layer 40 that consists essentially of nitrogen and boron in addition to the substrate material, typically silicon or germanium. The implantation of nitrogen and boron may occur in any sequence. For instance, the boron implantation may precede the nitrogen implantation, the selected order being a matter of process convenience rather than a requirement of the present invention.

Completion of the pMOSFET proceeds in accordance with the previously described known process steps. As illustrated in FIGS. 9 and 10, following creation of side wall spacers 28 and 30 to mask the p-junction extensions 46 and 48, deep junction boron implantation follows as shown by the arrows in FIG. 9 to produce the deep boron implanted junction portions 42 and 44 extending into the substrate 17 beyond the containment layer 40 and outside the areas masked by the side wall spacers 28 and 30. This step produces the shallow p-junction extensions 46 and 48 containing boron and nitrogen with the boron confined substantially within the containment layer 40.

It has been observed that in subsequent heat treatment of the wafer, as during subsequent annealing process steps, boron diffusion is limited in the containment layer 40 due to the presence of the nitrogen. Therefore, the size of the p-junction extensions 46 and 48 may be accurately controlled and in the absence of growth due to diffusion of boron made reliably very shallow. P-junction extensions 46 and 48 of less than 400 Å can thus be reliably achieved.

The resulting pMOSFET is shown in FIG. 11. As in FIG. 1, only the critical elements forming the transistor are shown to simplify the description and clearly show the differences between the structure of FIG. 11 and the previously known structures.

The FET comprises a substrate 17 having an n-type well 18. On the substrate surface 16 over the n-type well 18 there is built a gate 12 preferably of polysilicon. The gate 12 is isolated from the substrate surface 16 by a metal oxide layer 14 such as silicon oxide. The gate 12 defines a footprint area 50 under the gate 12. Typically, an insulating layer 15 is placed over the FET.

The FET further includes a drain and a source each comprising a deep p-type doped junction portion 42 and 44 and a shallow p-junction extension 46 and 48. The p-junction extensions 46 and 48 are substantially confined within the containment layer 40. Although the p-junction extensions 46 and 48 are shown as completely confined within the containment layer 40, depending on the original depth of the boron implantation and the subsequent heat treatment of the device, the p-junction extensions 46 and 48 may ultimately extend to a small degree outside the containment layer 40. The phrase "substantially confined" is intended to encompass such boron migration outside the physical limits of the containment layer 40 in the final product.

Figure 12:
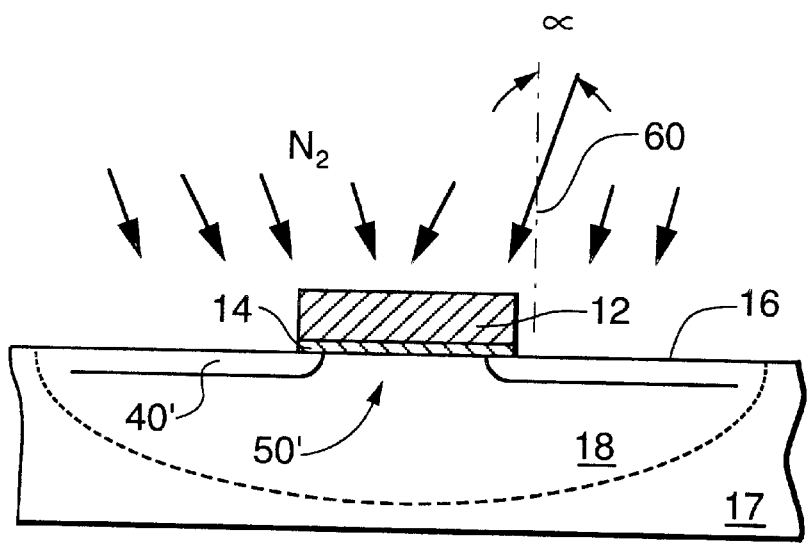
FIG. 12 is a schematic cross section of a process step according to the present invention for extending the containment layer partially under the area defined by the gate electrode.

In an alternate embodiment shown in FIG. 12, the implantation direction of the nitrogen is at an angle a relative to an axis 60 perpendicular to the surface 16 of the substrate 17. Consequently, the implanted nitrogen layer extends a small distance into the footprint area 50' defined by the gate 12. Boron doping may also be done at an angle a equal to or smaller than the angle used for the nitrogen implantation so that the containment layer 40' extends partially under the area defined by the gate 12. As illustrated in FIG. 12, such angled ion implantation may be performed at an angle α with respect to an axis 60 perpendicular to the wafer surface 16, such angle varying between about 0° and 45°.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A semiconductor field effect transistor device comprising:
   a silicon wafer substrate;
   a gate disposed over the substrate defining a first area on the substrate;
   a containment layer in the substrate extending outside the defined first area, the containment layer consisting essentially of implanted nitrogen, a boron dopant, and the substrate silicon; and
   a source and a drain each extending through the containment layer.

2. The device according to claim 1 wherein at least one of the source and the drain comprises a p junction extension substantially within the containment layer and a second portion extending substantially outside the containment layer into the substrate.

3. The device according to claim 2 wherein the substrate has a surface and wherein the containment layer extends from the surface of the substrate to a depth of about 300 Å to 800 Å in the substrate.

4. The device according to claim 1 wherein the containment layer extends partially in the first area defined by the gate disposed over the substrate.

* * * * *